United States Patent
Maheswari et al.

(10) Patent No.: US 12,066,472 B2
(45) Date of Patent: Aug. 20, 2024

(54) CALCULATING ENERGY LOSS DURING AN OUTAGE

(71) Applicant: SPARKCOGNITION, INC., Austin, TX (US)

(72) Inventors: Sahil Maheswari, Belmont, CA (US); Sandeep Gupta, Menlo Park, CA (US); Jayesh Shah, Santa Clara, CA (US); Kate Wessels, Kensington, CA (US)

(73) Assignee: SPARKCOGNITION, INC., Austin, TX (US)

( * ) Notice: Subject to any disclaimer, the term of this patent is extended or adjusted under 35 U.S.C. 154(b) by 0 days.

(21) Appl. No.: 17/566,383

(22) Filed: Dec. 30, 2021

(65) Prior Publication Data
US 2023/0213560 A1 Jul. 6, 2023

(51) Int. Cl.
*G01R 21/00* (2006.01)
*G01R 22/06* (2006.01)
(Continued)

(52) U.S. Cl.
CPC ............... *G01R 21/00* (2013.01); *G01W 1/10* (2013.01); *G01R 22/06* (2013.01); *G01R 31/003* (2013.01); *G01W 1/18* (2013.01); *G06N 20/00* (2019.01)

(58) Field of Classification Search
CPC ...... G01R 21/00; G01R 22/06; G01R 31/003; G01W 1/10; G01W 1/18; G06N 20/00
See application file for complete search history.

(56) References Cited

U.S. PATENT DOCUMENTS

2006/0173623 A1* 8/2006 Grzych .................. G01W 1/10
   702/3
2010/0274400 A1* 10/2010 Ormel .................... F03D 7/043
   700/287
(Continued)

FOREIGN PATENT DOCUMENTS

CN     109253056 B   *   6/2020  ............. F03D 17/00
CN     111350638 A   *   6/2020
(Continued)

OTHER PUBLICATIONS

Khan et al. (Accurate monitoring and fault detection in wind measuring devices through wireless sensor networks. Sensors (Basel). Nov. 24, 2014;14(11):22140-58. doi: 10.3390/s141122140. PMID: 25421739; PMCID: PMC4279582) (Year: 2014).*

*Primary Examiner* — Daniel R Miller
*Assistant Examiner* — Christian T Bryant

(57) ABSTRACT

Calculating energy loss during an outage, including: determining that windspeed data indicating device windspeeds measured at an energy generating device are unavailable within a particular time duration; receiving meteorological data associated with a site location of the energy generating device, the meteorological data including meteorological windspeed data collected within the particular time duration; and predicting one or more estimated device windspeeds at the energy generating device during the particular time duration based on the meteorological data using a trained model for the energy generating device, the trained model being trained using a machine learning algorithm that utilizes historical meteorological windspeed data associated with the site location collected during a previous time duration and corresponding historical device windspeed data measured at the energy generating device during the previous time duration.

17 Claims, 5 Drawing Sheets

(51) Int. Cl.
*G01W 1/10* (2006.01)
*G01W 1/18* (2006.01)
*G06N 20/00* (2019.01)
*G01R 31/00* (2006.01)

(56) References Cited

U.S. PATENT DOCUMENTS

2013/0073223 A1* 3/2013 Lapira .................... F03D 17/00
 702/34
2020/0049129 A1* 2/2020 Girardot .............. G05B 19/042
2021/0324835 A1* 10/2021 Motto ................... F03D 17/00
2022/0412318 A1* 12/2022 Zhao ....................... F03D 80/50

FOREIGN PATENT DOCUMENTS

CN 113642884 A * 11/2021
WO WO-2019066934 A1 * 4/2019

* cited by examiner

CALCULATING ENERGY LOSS DURING AN OUTAGE

BACKGROUND

Many devices require electrical energy to operate. As the number of energy consuming devices has increased, demand for electrical energy has also increased. With the increase in demand for electrical energy, new sources of electrical energy have emerged. Of particular interest are sources of renewable energy such as, for example, wind turbines, solar panels, and so on. The amount of energy that will be produced by such renewable sources of energy, however, is often a function of environmental factors that are out of the control of the owners, operators, and consumers of renewable energy. As such, calculating how much energy production is lost during an outage can be very challenging.

DETAILED DESCRIPTION

Figure 1:
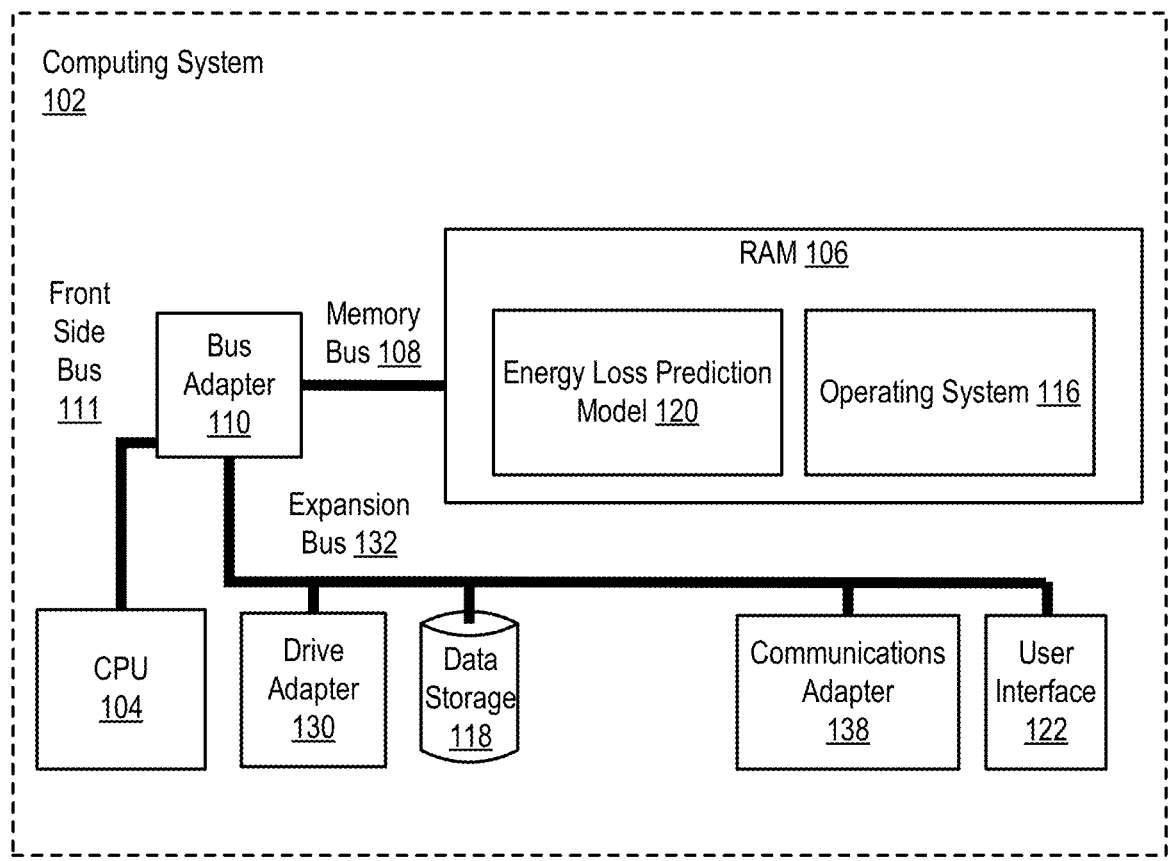
FIG. 1 is a block diagram of an example computer for calculating energy loss during an outage according to some embodiments.

Systems, methods, and products are described for calculating energy loss during an outage. According to a particular aspect, machine-learning models (e.g., neural networks) may be used to account for dynamic relationships among measurable values representing operation of a monitored system. The monitored system may be embodied as a collection of mechanical components, electrical components, and other components that collectively operate as an energy generator (i.e., a renewable energy generating asset). The monitored system may be embodied as, for example, one or more wind turbines, one or more solar panels, or some other energy generating asset.

The machine-learning models may be trained to establish a relationship between two or more measurable data values. The measurable data values may include, for example, a first data value that represents a wind speed measured by an anemometer that is mounted on a wind turbine and a second data value that represents the amount of energy generated by the wind turbine. The measurable data values may form a time series that includes multiple time windowed portions where each time windowed portion includes multivariate data (e.g., data from multiple sensors). In some implementations, the machine-learning model may be used to predict future values of the time-series data by using predicted measurable values as input. For example, given a predicted wind speed, the machine-learning model may be used to predict the amount of energy that a monitored wind turbine would generate, based on machine-learned correlations between measured wind speeds and measured energy output from the wind turbine. As such, the machine-learning model may evaluate input data to predict a future value of the time series. For example, the parameters may include link weights of a neural network, may include kernel parameters of a convolutional neural network (CNN), or may include both link weights and kernel parameters.

In some embodiments, two or more machine-learning models (e.g., neural networks) are used together to account for dynamic relationships among sensor data values representing operation of a monitored system. The sensor data values form a time series that includes multiple time windowed portions where each time windowed portion includes multivariate data (e.g., data from multiple sensors). In some implementations, a first machine-learning model evaluates input data based on multivariate sensor data from the monitored system to generate parameters for the second network. The second machine-learning model uses the parameters and input data to predict future values of the time-series data.

The parameters generated by the first machine-learning model are dependent on relationships among features of the time-series data. In some implementations, the first machine-learning model is a variational dimensional-reduction model that dimensionally reduces the input data and fits the dimensionally reduced input data to a probability distribution (e.g., a Gaussian distribution) to facilitate latent-space regularization and to facilitate separation of recognized operational states of the monitored system in the latent space. By way of illustration, in some implementations, the first machine-learning model is similar to a variational autoencoder except that, unlike an autoencoder, the first machine-learning model does not attempt to reproduce its input data. Rather, the first machine-learning model is trained to select appropriate parameters for the second machine-learning model.

The output of the first machine-learning model includes (or is mapped to) parameters that are used by the second machine-learning model to evaluate input data to predict a future value of the time series. For example, the parameters may include link weights of a neural network, may include kernel parameters of a convolutional neural network (CNN), or may include both link weights and kernel parameters.

Using two machine-learning models enables a monitoring system to perform forecasting in a manner that is state-dependent (e.g., is based on an inferred operating state of the monitored system), which may provide more accurate forecasting results when the monitored system is operating in any of several normal operating states. Additionally, in some implementations, the monitoring system can perform other operations, such as identifying the inferred operating state of the monitored system based on a dimensionally reduced encoding representing the input data. In such implementations, the inferred operating state can be used to improve situational awareness of operators associated with the monitored device. Additionally, or alternatively, the inferred operating state can be used to select a behavior model that can be used for anomaly detection (e.g., to determine whether the monitored system has deviated from the inferred operating state).

Used in this manner, the two machine-learning models may provide more accurate detection of changes in an operating state of the monitored system. Additionally, the situational awareness of operators of the monitored system can be improved, such as by providing output identifying an inferred operating state of the monitored system along with alerting information if the monitored system deviates from a particular operating state.

Particular aspects of the present disclosure are described below with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. Further the terms "comprise," "comprises," and "comprising" may be used interchangeably with "include," "includes," or "including." Additionally, the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

In the present disclosure, terms such as "determining," "calculating," "estimating," "shifting," "adjusting," etc. may be used to describe how one or more operations are performed. Such terms are not to be construed as limiting and other techniques may be utilized to perform similar operations. Additionally, as referred to herein, "generating," "calculating," "estimating," "using," "selecting," "accessing," and "determining" may be used interchangeably. For example, "generating," "calculating," "estimating," or "determining" a parameter (or a signal) may refer to actively generating, estimating, calculating, or determining the parameter (or the signal) or may refer to using, selecting, or accessing the parameter (or signal) that is already generated, such as by another component or device.

As used herein, "coupled" may include "communicatively coupled," "electrically coupled," or "physically coupled," and may also (or alternatively) include any combinations thereof. Two devices (or components) may be coupled (e.g., communicatively coupled, electrically coupled, or physically coupled) directly or indirectly via one or more other devices, components, wires, buses, networks (e.g., a wired network, a wireless network, or a combination thereof), etc. Two devices (or components) that are electrically coupled may be included in the same device or in different devices and may be connected via electronics, one or more connectors, or inductive coupling, as illustrative, non-limiting examples. In some implementations, two devices (or components) that are communicatively coupled, such as in electrical communication, may send and receive electrical signals (digital signals or analog signals) directly or indirectly, such as via one or more wires, buses, networks, etc. As used herein, "directly coupled" may include two devices that are coupled (e.g., communicatively coupled, electrically coupled, or physically coupled) without intervening components.

As used herein, the term "machine learning" should be understood to have any of its usual and customary meanings within the fields of computers science and data science, such meanings including, for example, processes or techniques by which one or more computers can learn to perform some operation or function without being explicitly programmed to do so. As a typical example, machine learning can be used to enable one or more computers to analyze data to identify patterns in data and generate a result based on the analysis. For certain types of machine learning, the results that are generated include data that indicates an underlying structure or pattern of the data itself. Such techniques, for example, include so called "clustering" techniques, which identify clusters (e.g., groupings of data elements of the data).

For certain types of machine learning, the results that are generated include a data model (also referred to as a "machine-learning model" or simply a "model"). Typically, a model is generated using a first data set to facilitate analysis of a second data set. For example, a first portion of a large body of data may be used to generate a model that can be used to analyze the remaining portion of the large body of data. As another example, a set of historical data can be used to generate a model that can be used to analyze future data.

Since a model can be used to evaluate a set of data that is distinct from the data used to generate the model, the model can be viewed as a type of software (e.g., instructions, parameters, or both) that is automatically generated by the computer(s) during the machine-learning process. As such, the model can be portable (e.g., can be generated at a first computer, and subsequently moved to a second computer for further training, for use, or both). Additionally, a model can be used in combination with one or more other models to perform a desired analysis. To illustrate, first data can be provided as input to a first model to generate first model output data, which can be provided (alone, with the first data, or with other data) as input to a second model to generate second model output data indicating a result of a desired analysis. Depending on the analysis and data involved, different combinations of models may be used to generate such results. In some examples, multiple models may provide model output that is input to a single model. In some examples, a single model provides model output to multiple models as input.

Examples of machine-learning models include, without limitation, perceptrons, neural networks, support vector machines, regression models, decision trees, Bayesian models, Boltzmann machines, adaptive neuro-fuzzy inference systems, as well as combinations, ensembles and variants of these and other types of models. Variants of neural networks include, for example and without limitation, prototypical networks, autoencoders, transformers, self-attention networks, convolutional neural networks, deep neural networks, deep belief networks, etc. Variants of decision trees include, for example and without limitation, random forests, boosted decision trees, etc.

Since machine-learning models are generated by computer(s) based on input data, machine-learning models can be discussed in terms of at least two distinct time windows—a creation/training phase and a runtime phase. During the creation/training phase, a model is created, trained, adapted, validated, or otherwise configured by the computer based on the input data (which in the creation/training phase, is generally referred to as "training data"). Note that the trained model corresponds to software that has been generated and/or refined during the creation/training phase to perform particular operations, such as classification, prediction, encoding, or other data analysis or data synthesis operations. During the runtime phase (or "inference" phase), the model is used to analyze input data to generate model output. The content of the model output depends on the type of model. For example, a model can be trained to perform classification tasks or regression tasks, as non-limiting examples. In some implementations, a model may be continuously, periodically, or occasionally updated, in which case training time and runtime may be interleaved or one version of the model can be used for inference while a copy is updated, after which the updated copy may be deployed for inference.

In some implementations, a previously generated model is trained (or re-trained) using a machine-learning technique. In this context, "training" refers to adapting the model or parameters of the model to a particular data set. Unless otherwise clear from the specific context, the term "training" as used herein includes "re-training" or refining a model for a specific data set. For example, training may include so called "transfer learning." As described further below, in transfer learning a base model may be trained using a generic or typical data set, and the base model may be subsequently refined (e.g., re-trained or further trained) using a more specific data set.

A data set used during training is referred to as a "training data set" or simply "training data". The data set may be labeled or unlabeled. "Labeled data" refers to data that has been assigned a categorical label indicating a group or category with which the data is associated, and "unlabeled data" refers to data that is not labeled. Typically, "supervised machine-learning processes" use labeled data to train a machine-learning model, and "unsupervised machine-learning processes" use unlabeled data to train a machine-learning model; however, it should be understood that a label associated with data is itself merely another data element that can be used in any appropriate machine-learning process. To illustrate, many clustering operations can operate using unlabeled data; however, such a clustering operation can use labeled data by ignoring labels assigned to data or by treating the labels the same as other data elements.

Machine-learning models can be initialized from scratch (e.g., by a user, such as a data scientist) or using a guided process (e.g., using a template or previously built model). Initializing the model includes specifying parameters and hyperparameters of the model. "Hyperparameters" are characteristics of a model that are not modified during training, and "parameters" of the model are characteristics of the model that are modified during training. The term "hyperparameters" may also be used to refer to parameters of the training process itself, such as a learning rate of the training process. In some examples, the hyperparameters of the model are specified based on the task the model is being created for, such as the type of data the model is to use, the goal of the model (e.g., classification, regression, anomaly detection), etc. The hyperparameters may also be specified based on other design goals associated with the model, such as a memory footprint limit, where and when the model is to be used, etc.

Model type and model architecture of a model illustrate a distinction between model generation and model training. The model type of a model, the model architecture of the model, or both, can be specified by a user or can be automatically determined by a computing device. However, neither the model type nor the model architecture of a particular model is changed during training of the particular model. Thus, the model type and model architecture are hyperparameters of the model and specifying the model type and model architecture is an aspect of model generation (rather than an aspect of model training). In this context, a "model type" refers to the specific type or sub-type of the machine-learning model. As noted above, examples of machine-learning model types include, without limitation, perceptrons, neural networks, support vector machines, regression models, decision trees, Bayesian models, Boltzmann machines, adaptive neuro-fuzzy inference systems, as well as combinations, ensembles and variants of these and other types of models. In this context, "model architecture" (or simply "architecture") refers to the number and arrangement of model components, such as nodes or layers, of a model, and which model components provide data to or receive data from other model components. As a non-limiting example, the architecture of a neural network may be specified in terms of nodes and links. To illustrate, a neural network architecture may specify the number of nodes in an input layer of the neural network, the number of hidden layers of the neural network, the number of nodes in each hidden layer, the number of nodes of an output layer, and which nodes are connected to other nodes (e.g., to provide input or receive output). As another non-limiting example, the architecture of a neural network may be specified in terms of layers. To illustrate, the neural network architecture may specify the number and arrangement of specific types of functional layers, such as long-short-term memory (LSTM) layers, fully connected (FC) layers, convolution layers, etc. While the architecture of a neural network implicitly or explicitly describes links between nodes or layers, the architecture does not specify link weights. Rather, link weights are parameters of a model (rather than hyperparameters of the model) and are modified during training of the model.

In many implementations, a data scientist selects the model type before training begins. However, in some implementations, a user may specify one or more goals (e.g., classification or regression), and automated tools may select one or more model types that are compatible with the specified goal(s). In such implementations, more than one model type may be selected, and one or more models of each selected model type can be generated and trained. A best performing model (based on specified criteria) can be selected from among the models representing the various model types. Note that in this process, no particular model type is specified in advance by the user, yet the models are trained according to their respective model types. Thus, the model type of any particular model does not change during training.

Similarly, in some implementations, the model architecture is specified in advance (e.g., by a data scientist); whereas in other implementations, a process that both generates and trains a model is used. Generating (or generating and training) the model using one or more machine-learning techniques is referred to herein as "automated model building". In one example of automated model building, an initial set of candidate models is selected or generated, and then one or more of the candidate models are trained and evaluated. In some implementations, after one or more rounds of changing hyperparameters and/or parameters of the candidate model(s), one or more of the candidate models may be selected for deployment (e.g., for use in a runtime phase).

Certain aspects of an automated model building process may be defined in advance (e.g., based on user settings, default values, or heuristic analysis of a training data set) and other aspects of the automated model building process may be determined using a randomized process. For example, the architectures of one or more models of the initial set of models can be determined randomly within predefined limits. As another example, a termination condition may be specified by the user or based on configurations settings. The termination condition indicates when the automated model building process should stop. To illustrate, a termination condition may indicate a maximum number of iterations of the automated model building process, in which case the automated model building process stops when an iteration counter reaches a specified value. As another illustrative example, a termination condition may indicate that the automated model building process should stop when a reliability metric associated with a particular model satisfies a threshold. As yet another illustrative example, a termination condition may indicate that the automated model building process should stop if a metric that indicates improvement of one or more models over time (e.g., between iterations) satisfies a threshold. In some implementations, multiple termination conditions, such as an iteration count condition, a time limit condition, and a rate of improvement condition can be specified, and the automated model building process can stop when one or more of these conditions is satisfied.

Another example of training a previously generated model is transfer learning. "Transfer learning" refers to initializing a model for a particular data set using a model that was trained using a different data set. For example, a "general purpose" model can be trained to detect anomalies in vibration data associated with a variety of types of rotary equipment, and the general-purpose model can be used as the starting point to train a model for one or more specific types of rotary equipment, such as a first model for generators and a second model for pumps. As another example, a general-purpose natural-language processing model can be trained using a large selection of natural-language text in one or more target languages. In this example, the general-purpose natural-language processing model can be used as a starting point to train one or more models for specific natural-language processing tasks, such as translation between two languages, question answering, or classifying the subject matter of documents. Often, transfer learning can converge to a useful model more quickly than building and training the model from scratch.

Training a model based on a training data set generally involves changing parameters of the model with a goal of causing the output of the model to have particular characteristics based on data input to the model. To distinguish from model generation operations, model training may be referred to herein as optimization or optimization training. In this context, "optimization" refers to improving a metric, and does not mean finding an ideal (e.g., global maximum or global minimum) value of the metric. Examples of optimization trainers include, without limitation, backpropagation trainers, derivative free optimizers (DFOs), and extreme learning machines (ELMs). As one example of training a model, during supervised training of a neural network, an input data sample is associated with a label. When the input data sample is provided to the model, the model generates output data, which is compared to the label associated with the input data sample to generate an error value. Parameters of the model are modified in an attempt to reduce (e.g., optimize) the error value. As another example of training a model, during unsupervised training of an autoencoder, a data sample is provided as input to the autoencoder, and the autoencoder reduces the dimensionality of the data sample (which is a lossy operation) and attempts to reconstruct the data sample as output data. In this example, the output data is compared to the input data sample to generate a reconstruction loss, and parameters of the autoencoder are modified in an attempt to reduce (e.g., optimize) the reconstruction loss.

As another example, to use supervised training to train a model to perform a classification task, each data element of a training data set may be labeled to indicate a category or categories to which the data element belongs. In this example, during the creation/training phase, data elements are input to the model being trained, and the model generates output indicating categories to which the model assigns the data elements. The category labels associated with the data elements are compared to the categories assigned by the model. The computer modifies the model until the model accurately and reliably (e.g., within some specified criteria) assigns the correct labels to the data elements. In this example, the model can subsequently be used (in a runtime phase) to receive unknown (e.g., unlabeled) data elements, and assign labels to the unknown data elements. In an unsupervised training scenario, the labels may be omitted. During the creation/training phase, model parameters may be tuned by the training algorithm in use such that the during the runtime phase, the model is configured to determine which of multiple unlabeled "clusters" an input data sample is most likely to belong to.

As another example, to train a model to perform a regression task, during the creation/training phase, one or more data elements of the training data are input to the model being trained, and the model generates output indicating a predicted value of one or more other data elements of the training data. The predicted values of the training data are compared to corresponding actual values of the training data, and the computer modifies the model until the model accurately and reliably (e.g., within some specified criteria) predicts values of the training data. In this example, the model can subsequently be used (in a runtime phase) to receive data elements and predict values that have not been received. To illustrate, the model can analyze time-series data, in which case, the model can predict one or more future values of the time series based on one or more prior values of the time series.

In some aspects, the output of a model can be subjected to further analysis operations to generate a desired result. To illustrate, in response to particular input data, a classification model (e.g., a model trained to perform classification tasks) may generate output including an array of classification scores, such as one score per classification category that the model is trained to assign. Each score is indicative of a likelihood (based on the model's analysis) that the particular input data should be assigned to the respective category. In this illustrative example, the output of the model may be subjected to a softmax operation to convert the output to a probability distribution indicating, for each category label, a probability that the input data should be assigned the corresponding label. In some implementations, the probability distribution may be further processed to generate a one-hot encoded array. In other examples, other operations that retain one or more category labels and a likelihood value associated with each of the one or more category labels can be used.

One example of a machine-learning model is an autoencoder. An autoencoder is a particular type of neural network that is trained to receive multivariate input data, to process at least a subset of the multivariate input data via one or more hidden layers, and to perform operations to reconstruct the multivariate input data using output of the hidden layers. If at least one hidden layer of an autoencoder includes fewer nodes than the input layer of the autoencoder, the autoencoder may be considered a type of dimensional-reduction model. If each of the one or more hidden layer(s) of the autoencoder includes more nodes than the input layer of the autoencoder, the autoencoder may be referred to herein as a denoising model or a sparse model, as explained further below.

For dimensional reduction type autoencoders, the hidden layer with the fewest nodes is referred to as the latent-space layer. Thus, a dimensional reduction autoencoder is trained to receive multivariate input data, to perform operations to dimensionally reduce the multivariate input data to generate latent-space data in the latent-space layer, and to perform operations to reconstruct the multivariate input data using the latent-space data.

As used herein, "dimensional reduction" refers to representing n values of multivariate input data using z values (e.g., as latent-space data), where n and z are integers and z is less than n. Often, in an autoencoder the z values of the latent-space data are then dimensionally expanded to generate n values of output data. In some special cases, a dimensional-reduction model may generate m values of output data, where m is an integer that is not equal to n. As used herein, such special cases are still referred to as autoencoders as long as the data values represented by the input data are a subset of the data values represented by the output data or the data values represented by the output data are a subset of the data values represented by the input data. For example, if the multivariate input data includes 10 sensor data values from 10 sensors, and the dimensional-reduction model is trained to generate output data representing only 5 sensor data values corresponding to 5 of the 10 sensors, then the dimensional-reduction model is referred to herein as an autoencoder. As another example, if the multivariate input data includes 10 sensor data values from 10 sensors, and the dimensional-reduction model is trained to generate output data representing 10 sensor data values corresponding to the 10 sensors and to generate a variance value (or other statistical metric) for each of the sensor data values, then the dimensional-reduction model is also referred to herein as an autoencoder (e.g., a variational autoencoder). If a model performs dimensional reduction but does not attempt to recreate the input data, the model is referred to herein merely as a dimensional-reduction model.

Denoising autoencoders and sparse autoencoders do not include a latent-space layer to force changes in the input data. An autoencoder without a latent-space layer could simply pass the input data, unchanged, to the output nodes resulting in a model with little utility. Denoising autoencoders avoid this result by zeroing out a subset of values of an input data set while training the denoising autoencoder to reproduce the entire input data set at the output nodes. Put another way, the denoising autoencoder is trained to reproduce an entire input data sample based on input data that includes less than the entire input data sample. For example, during training of a denoising autoencoder that includes 10 nodes in the input layer and 10 nodes in the output layer, a single set of input data values includes 10 data values; however, only a subset of the 10 data values (e.g., between 2 and 9 data values) are provided to the input layer. The remaining data values are zeroed out. To illustrate, out of 10 data values, 7 data values may be provided to a respective 7 nodes of the input layer, and zero values may be provided to the other 3 nodes of the input layer. Fitness of the denoising autoencoder is evaluated based on how well the output layer reproduces all 10 data values of the set of input data values, and during training, parameters of the denoising autoencoder are modified over multiple iterations to improve its fitness.

Sparse autoencoders prevent passing the input data unchanged to the output nodes by selectively activating a subset of nodes of one or more of the hidden layers of the sparse autoencoder. For example, if a particular hidden layer has 10 nodes, only 3 nodes may be activated for particular data. The sparse autoencoder is trained such that which nodes are activated is data dependent. For example, for a first data sample, 3 nodes of the particular hidden layer may be activated, whereas for a second data sample, 5 nodes of the particular hidden layer may be activated.

Predicting energy production for energy generating assets in accordance with the present disclosure is generally implemented with computers, that is, with automated computing machinery. For further explanation, therefore, FIG. 1 sets forth a block diagram of automated computing machinery comprising an example computing system 102 configured for calculating energy loss during an outage according to some embodiments of the present disclosure. The computing system 102 of FIG. 1 includes a Central Processing Unit ('CPU') 104 as well as random access memory ('RAM') 106 which is connected through a high speed memory bus 108 and bus adapter 110 to the CPU 104 via a front side bus 111 and to other components of the computing system 102. Although a CPU 104 is illustrated in the example depicted in FIG. 1, in other embodiments other forms of processing devices may be utilized such as, for example, an application-specific integrated circuit ('ASIC'), field-programmable gate array ('FPGA'), and so on.

Stored in RAM 106 is an energy loss prediction model 120. The energy loss prediction model 120 may be embodied as a module of computer program instructions that, when executed, cause the computing system to carry out (among other steps) the steps of: determining that windspeed data indicating device windspeeds measured at an energy generating device are unavailable within a particular time duration; receiving meteorological data associated with a site location of the energy generating device, the meteorological data including meteorological windspeed data collected within the particular time duration; and predicting one or more estimated device windspeeds at the energy generating device during the particular time duration based on the meteorological data using a trained model for the energy generating device, the trained model being trained using a machine learning algorithm that utilizes historical meteorological windspeed data associated with the site location collected during a previous time duration and corresponding historical device windspeed data measured at the energy generating device during the previous time duration. The energy loss prediction model 120 may be embodied as a trained model that was trained using a machine learning algorithm that utilizes historical measured meteorological data associated with the location of the energy generating asset and historical meteorological data measured elsewhere to predict the meteorological conditions that were present at the site of an energy generating device during an outage. By predicting the meteorological conditions that were present at the site of an energy generating device during an outage, the amount of energy production loss that occurred during the outage can be determined. That is, a determination can be made as to how much energy the energy generating device would have generated if not for the outage.

Further stored in RAM 106 is an operating system 116. Operating systems 116 useful in vehicles in accordance with some embodiments of the present disclosure include UNIX™, Linux™, Microsoft Windows™, AIX™, IBM's i OS™, and others as will occur to those of skill in the art. The energy loss prediction model 120 and the operating system 116 in the example of FIG. 1 are shown in RAM 106, but many components of such software may alternatively be stored in non-volatile memory also, such as, for example, on data storage 118, such as a disk drive. Moreover, any of the energy loss prediction model 120 may be executed in a virtual machine and facilitated by a guest operating system of that virtual machine.

The computing system 102 of FIG. 1 includes disk drive adapter 130 coupled through expansion bus 132 and bus adapter 110 to CPU 104 and other components of the computing system 102. Disk drive adapter 130 connects non-volatile data storage to the computing system 102 in the form of data storage 118 (which may in alternative embodiments be accessible directly via the expansion bus 132 without going through the disk drive adapter). Disk drive adapters 130 useful in computers configured for contactless payment from a vehicle according to embodiments of the present invention include Integrated Drive Electronics ('IDE') adapters, Small Computer System Interface ('SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The computing system 102 of FIG. 1 also includes a communications adapter 138 for data communications with other computers and for data communications with a data communications network. Such data communications may be carried out serially through RS-138 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful in computers configured for contactless payment from a vehicle according to embodiments of the present invention include modems for wired dial-up communications, Ethernet (IEEE 802.3) adapters for wired data communications, 802.11 adapters for wireless data communications, as well as mobile adapters (e.g., cellular communications adapters) for mobile data communications.

Readers will appreciate that although the example embodiment depicted in FIG. 1 relates to an embodiment where an energy loss prediction model 120 is executed in a computing system 102, in other embodiments the energy loss prediction model 120 may be executed elsewhere. For example, the energy loss prediction model 120 may be executed in one or more cloud computing environments such as, for example, Amazon AWS, Google Cloud Platform, Microsoft Azure, and so on. In such an example, the energy loss prediction model 120 may be executed on one or more cloud computing instances (e.g., one or more EC2 instances), on one or more virtual machines, in one or more containers, or in some other way.

Figure 2:
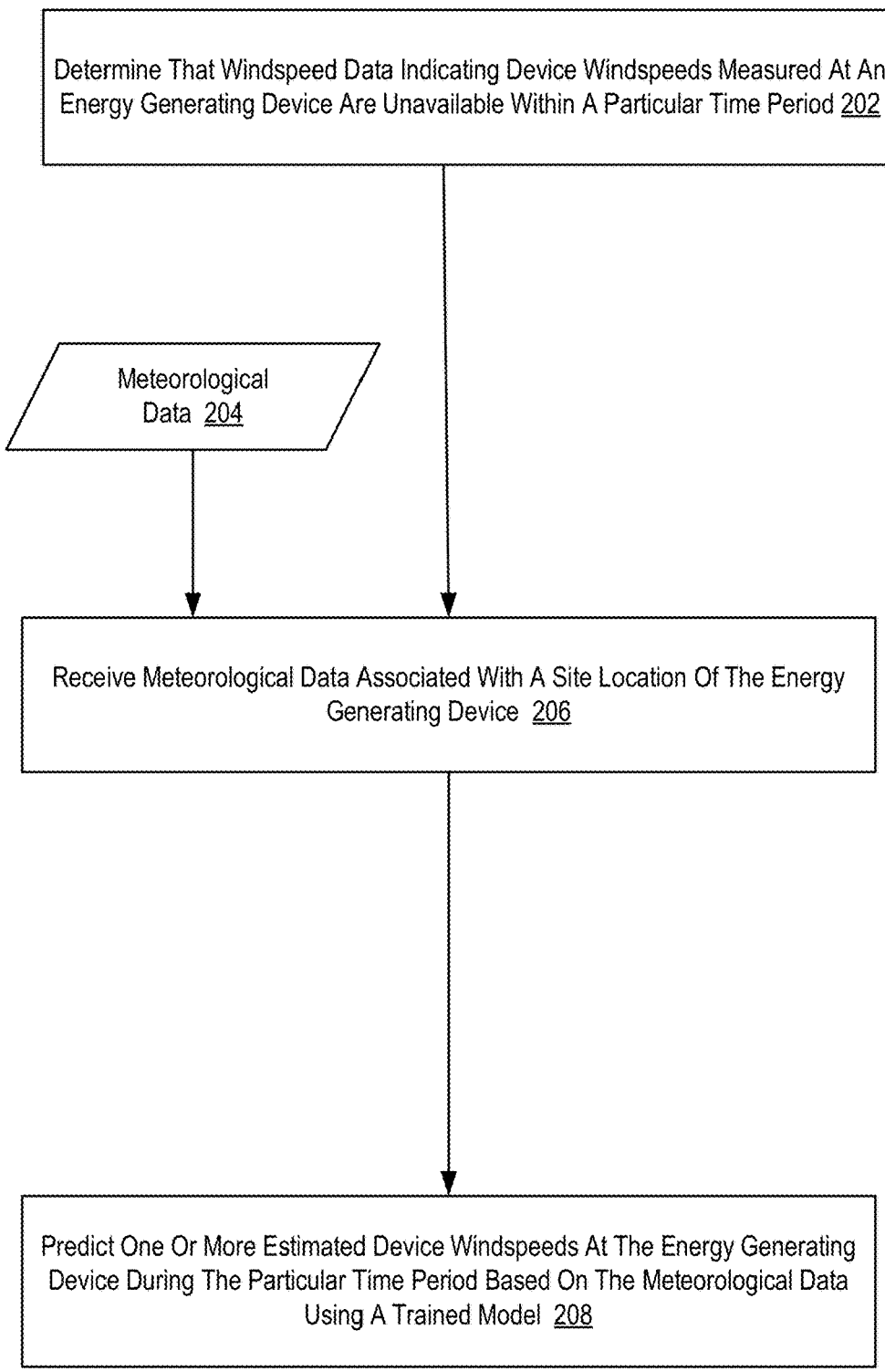
FIG. 2 sets forth a flowchart illustrating an example method of calculating energy loss during an outage in accordance with some embodiments of the present disclosure.

For further explanation, FIG. 2 sets forth a flowchart illustrating an example method of calculating energy loss during an outage in accordance with some embodiments of the present disclosure. The example method depicted in FIG. 2 may be carried out, for example, by one or more modules of computer program instructions executing on computer hardware, by one or more modules of computer program instructions executing on virtualized computer hardware, by one or more modules of computer program instructions executing in a container, or by one or more modules of computer program instructions executing in some other form of execution environment. The example method depicted in FIG. 2 may similarly be carried out by an apparatus, system, or other device that is configured to execute computer program instructions specifically designed to carry out the steps described herein.

The example method depicted in FIG. 2 includes determining 202 that windspeed data indicating device windspeeds measured at an energy generating device are unavailable within a particular time duration. In an example, the particular time duration may correspond to a downtime event of the energy generating device such as a maintenance or repair procedure. The energy generating device may be embodied, for example, as a wind turbine. Although various examples are described herein using a single energy generating device, it should be understood that in other embodiments multiple energy generating devices may be used. For example, a number of wind turbines may be located at a site to form a wind farm. The windspeed data may include one or more windspeed measurements that are normally taken by one or more instruments, such as an anemometer, mounted to or proximate to the energy generating device. However, sometimes this windspeed data may become unavailable, for example, due to equipment downtime or failure.

Owners and operators of renewable energy plants often want to track estimated energy loss due to various alarms and events such as equipment downtime. Oftentimes when an energy generating device, such as a wind turbine, is offline or in cases of a balance of plant (BOP) outage, the energy generating device is not able to report data used to estimate the correct energy losses. BOP in the context of power engineering generally refers to supporting components and auxiliary systems of a power plant, such as transformer and inverters, needed to deliver energy other than the generating unit itself. It is important to know the wind speed the energy generating device would have received during the downtime to appropriately calculate the potential losses for that time. For renewable energy power plants due to high variation in the fuel source (e.g., wind or solar irradiance), the loss can vary widely for each alarm event. Even during the exact same time, various devices (e.g., turbines or inverters) can have losses that vary significantly due to device specific factors such as wake effect or shadowing. As a wind turbine extracts energy from the wind, a downstream wake is created from the wind turbine in which wind speed is reduced. As the flow proceeds downstream, there is a spreading of the wake, and the wake recovers towards free stream conditions. The wake effect is the aggregated influence on the energy production of the wind farm, which results from the changes in wind speed caused by the impact of the turbines on each other. As a result of these variations, inaccurate reporting of energy loss and energy-based availability (EBA) calculations of the renewable energy plant may occur. EBA refers to the amount of energy that could be produced by the energy generating device or a number of energy generating devices at a site location in comparison to actual reported production.

While the true windspeed can most accurately be obtained by an anemometer or other device at the turbine hub height, various embodiments described herein utilize past meteorological data and device data to create a trained model to calculate wind speeds when provided with meteorological windspeeds or windspeeds from a third-party source associated with the site of the energy generating device as further described below.

The example method depicted in FIG. 2 also includes receiving 206 meteorological data 204 associated with a site location of the energy generating device. The meteorological data 204 includes meteorological windspeed data collected within the particular time duration. The meteorological data 204 may be embodied, for example, as a data structure, a file, or a stream of data from a meteorological data feed. The meteorological data 204 may include information describing, for example, a windspeed at a particular point in time and/or a predicted wind direction at a particular point in time. The meteorological data 204 may include information describing measured or predicted windspeeds for the location at the particular time such as, for example, the duration for which the device windspeed data is not available. In an embodiment, predicted windspeeds may be determined by a weather prediction algorithm utilizing a weather forecast model or an ensemble of weather forecast models.

In the example method depicted in FIG. 2, the meteorological data 204 may be received 206, for example, via a weather feed from a server, or via meteorological data from sensors located proximate to or remote from the location of the energy generating device. As an example in which the meteorological data 204 is received from one or more sensors, the meteorological data 204 may be received via one or more anemometers that are positioned at various locations within the wind farm described above. As such, the meteorological data 204 that is associated with a site location of the energy generating device may be received 206 by measuring such data 204 at the site location of the energy generating device.

The example method depicted in FIG. 2 also includes predicting 208 one or more estimated device windspeeds at the energy generating device during the particular time duration based on the meteorological data 204 using a trained model for the energy generating device. In a particular embodiment, wherein the one or more estimated device windspeeds correspond to an estimated windspeeds at a height of a turbine hub of a wind turbine. The trained model is trained using a machine learning algorithm that utilizes historical meteorological windspeed data associated with the site location collected during a previous time duration and corresponding historical device windspeed data measured at the energy generating device during the previous time duration. Such machine learning algorithms can include, for example regression learning algorithms, unsupervised learning algorithms, supervised learning algorithms, neural network algorithms, deep learning algorithms, learning vector quantization algorithms, decision tree algorithms, or other suitable machine learning algorithms.

The historical meteorological windspeed data associated with the site location may include windspeed data associated with previously recorded windspeeds for the site that were previously directly measured by one or more instruments at the site location or previously forecasted for the site location by a weather service during the particular time duration. The historical device windspeed data may include windspeeds measured at the energy generating device, such as at turbine hub height of a wind turbine, during the same particular time duration of the historical meteorological windspeed data. Readers will appreciate that in other embodiments, additional information (e.g., wind direction) may be included in the training data that is used to generate a trained model that can predict the wind speed at the turbine based on measured readings from other sensors.

In a particular embodiment, a regression model is created for the energy generating device using the historical meteorological windspeed data and corresponding historical device windspeed data to calculate device windspeeds when provided with meteorological windspeeds or wind speeds from a third-party data source for the site. Once the regression model is created, the regression model can be used to calculate the appropriate device windspeeds per energy generating device for durations in which data is missing or otherwise unavailable. The regression model allows for capture of turbine/device specific conditions such as wake effects from other turbines to provide an improved or optimal wind speed for each energy generating device in order to accurate calculate energy losses during downtimes as further described herein.

In an embodiment, a site location may include a number of different energy generating devices and a different trained model specific for each of the energy generating device may be created using historical meteorological windspeed data associated with the site location collected during a previous time duration and corresponding historical device windspeed data measured at the particular energy generating device during the previous time duration. During the particular embodiment, an estimated device windspeed for each energy generating device is predicted using the meteorological data 204 and the trained model corresponding to the particular energy generating device.

Figure 3:
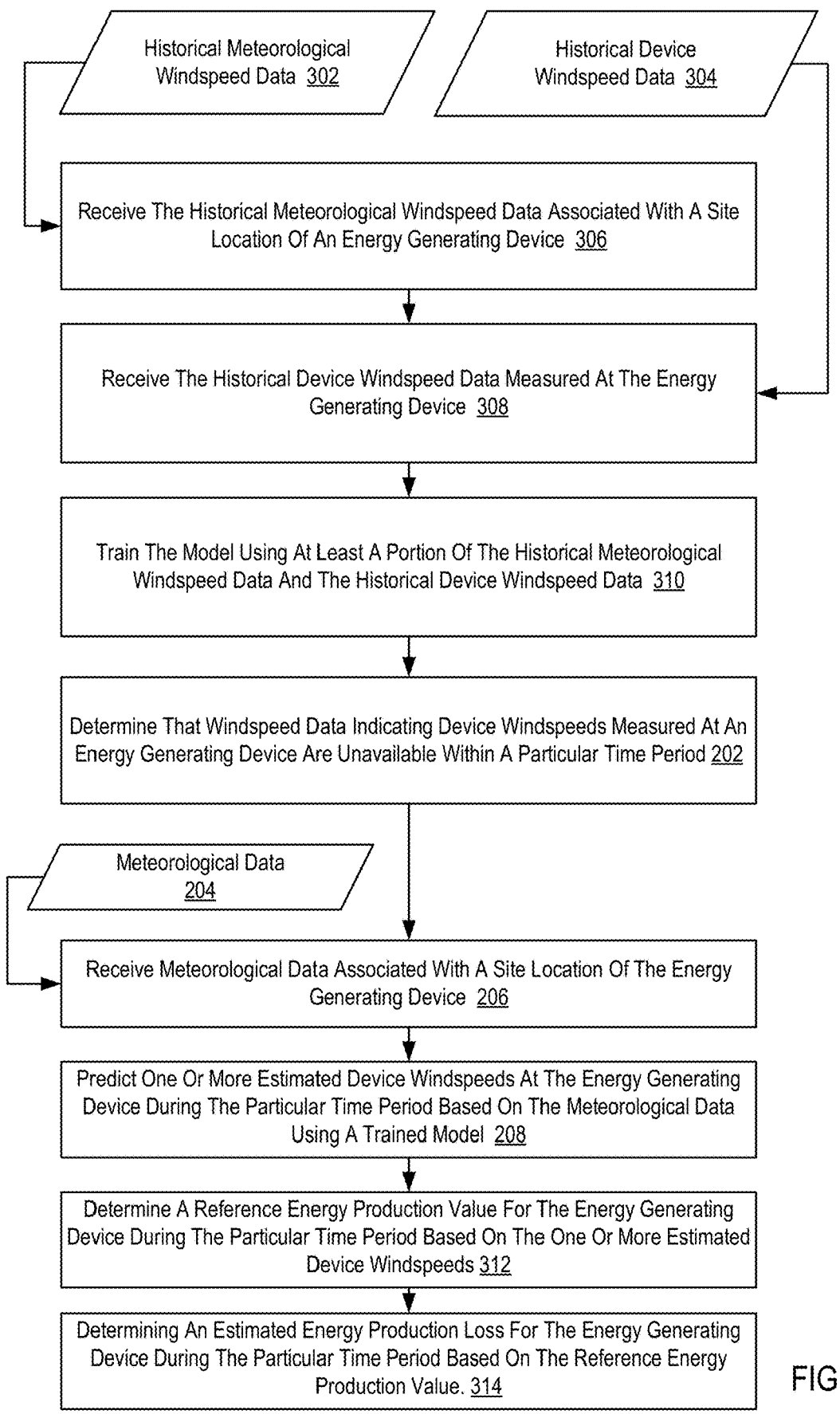
FIG. 3 sets forth a flowchart illustrating an additional example method of calculating energy loss during an outage in accordance with some embodiments of the present disclosure.

For further explanation, FIG. 3 sets forth a flowchart illustrating an additional example method of calculating energy loss during an outage in accordance with some embodiments of the present disclosure. The example depicted in FIG. 3 is similar to the example depicted in FIG. 2, as the example depicted in FIG. 3 also includes receiving 206 meteorological data 204 associated with a site location of an energy generating device and predicting 208 one or more estimated device windspeeds at the energy generating device during the particular time duration based on the meteorological data 204 using a trained model for the energy generating device. For example, it may be desired to predict one or more estimated device windspeeds for the energy generating device at a time during which windspeed data indicating device windspeeds measured at the energy generating device are unavailable.

In still another example, meteorological data may be received from a number of sources at different locations near the energy generating device, and the meteorological data 204 associated with the site location of the energy generating device may be computed using one or more of the individual current meteorological data received from each of the sources. In a particular example, the individual meteorological data may each be weighted according to a weighting algorithm, and a weighted combination, such as an average, of the individual meteorological data may be used to compute the meteorological data 204 to be used as an input to the trained model to predict the estimated device windspeeds associated with the energy generating device during the particular time period. In another particular example, one of the individual sources may be determined to be the "best" source for meteorological data for the site location of the energy generating device and be used as the meteorological data 204 to be input to the trained model to predict the estimated device windspeeds associated with the energy generating device during the particular time period.

The example method depicted in FIG. 3 also includes receiving 306 the historical meteorological windspeed data 302 associated with the site location of the energy generating device. The historical meteorological windspeed data 302 may be embodied as, for example, a data structure, a file, or a stream of data from a meteorological data feed. The historical meteorological windspeed data 302 may include, for example, historical wind speeds and/or historical wind directions associated with the site location of the energy generating device. In an example, the historical meteorological windspeed data 302 associated with the site location of the energy generating device may include historical wind speeds for the previous month at particular times during the month. In another example, the historical meteorological windspeed data 302 may include historical wind speeds for the previous year at particular times during the year.

In the example method depicted in FIG. 3, the historical meteorological windspeed data 302 may be received 306, for example, by querying a database or repository storing historical meteorological windspeed data associated with the location and receiving a response to the query including the request historical meteorological windspeed data 302. In an embodiment, the repository is created and historical meteorological windspeed data 302 is obtained from one or more meteorological data sources, such as a weather service, and stored in the repository. In various embodiments, the repository may be located either at a remote location from the energy generating asset or proximate to the energy generating asset. In one or more embodiments, the historical meteorological windspeed data 302 may be stored using a cloud storage service.

The example method depicted in FIG. 3 also includes receiving 308 the historical device windspeed data 304 associated with the historical device windspeeds measured at the energy generating device. The historical device windspeed data 304 may be embodied as, for example, a data structure, a file, or a stream of data from a data feed. In an example embodiment, the historical device windspeed data 304 may include device windspeeds measure at the energy generating device at times corresponding to the those of the historical meteorological windspeed data 302. In another example embodiment, if portions of the historical meteorological windspeed data 302 and historical device windspeed data 304 are collected at different times, interpolation may be used to correlate times of the historical meteorological windspeed data 302 and historical device windspeed data 304.

In the example method depicted in FIG. 3, the historical device windspeed data 304 may be received 308, for example, by querying a database or repository storing historical windspeed data associated with the energy generating device and receiving a response to the query including the requested historical device windspeed data. In an embodiment, the repository is created and the historical device windspeed data 304 is obtained from previously measured device windspeeds of the energy generating device and stored in the repository. In various embodiments, the repository may be located either at a remote location from the energy generating device or proximate to the energy generating device. In one or more embodiments, the historical device windspeed data 304 may be stored using a cloud storage service.

The example method depicted in FIG. 3 also includes training 310 the model using at least a portion of the historical meteorological windspeed data 302 and the historical device windspeed data 304. Training 310 the model may be carried out, for example, through the use of one or more machine learning algorithms that can correlate historical meteorological windspeed data 302 with historical device windspeed data 304. Such machine learning algorithms can include, for example regression learning algorithms, unsupervised learning algorithms, supervised learning algorithms, neural network algorithms, deep learning algorithms, learning vector quantization algorithms, decision tree algorithms, or other suitable machine learning algorithms. During the training 310, the trained model may be trained using a machine learning algorithm that utilizes the historical meteorological windspeed data 302 associated with the site location of the energy generating device and historical device windspeed data 304 associated with the energy generating device. The model may be trained using historical meteorological windspeed data 302 that covers a range of various meteorological conditions expected to be experienced by the energy generating device and a range of device windspeeds corresponding to the various meteorological conditions to produce an accurate trained model of the energy generating device.

Through the use of the machine learning algorithms and techniques, a model may be generated that can receive meteorological data associated with a site location of an energy generating device and predict one or more estimated device windspeeds at the energy generating device during a particular time period in which device windspeeds measured at the energy generating device are unavailable.

Figure 4:
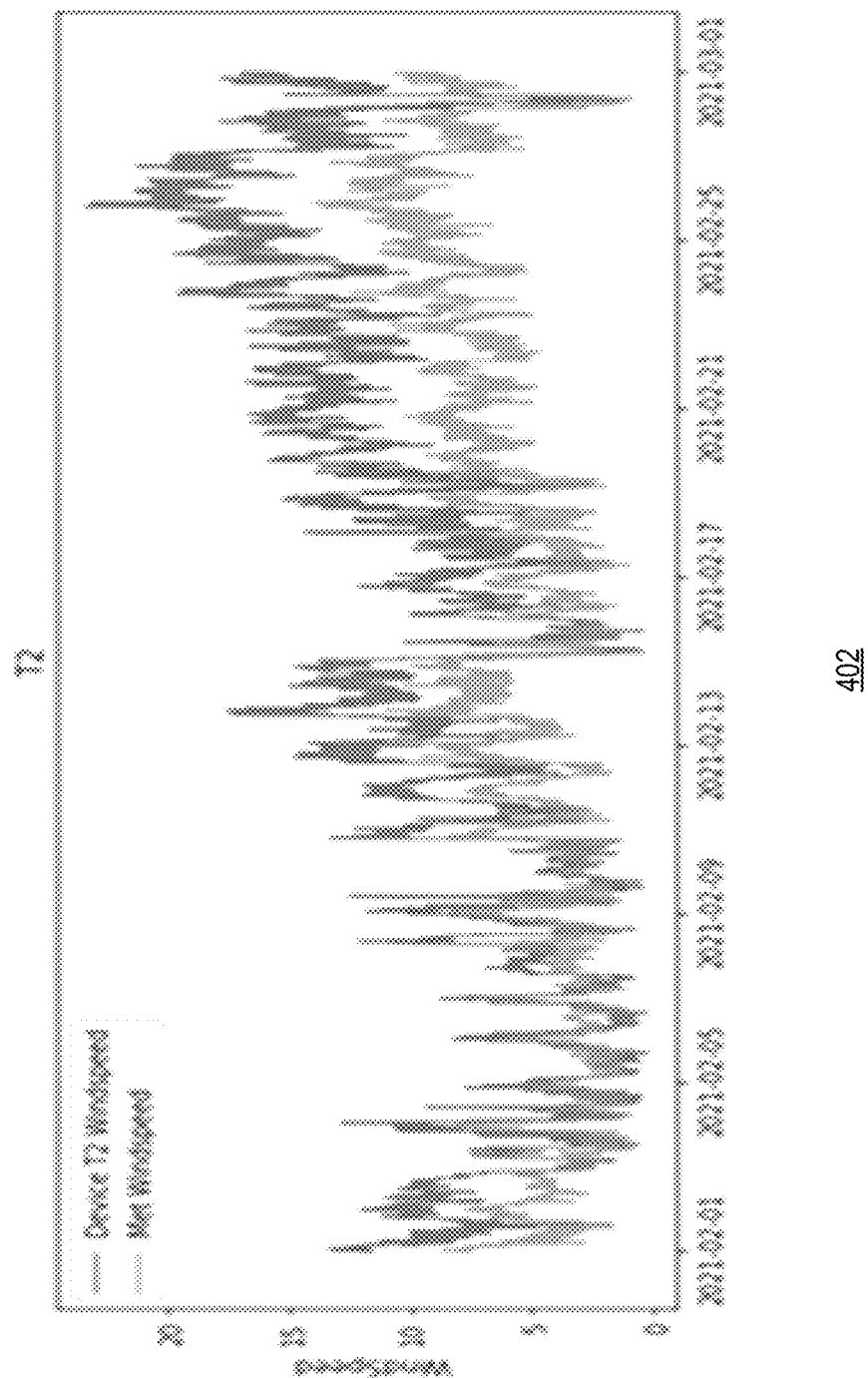
FIG. 4 depicts an example baseline time series windspeed plot illustrating device windspeeds and meteorological windspeeds in accordance with some embodiments of the present disclosure.

In a particular example, past meteorological data and device data is used to create a regression model to calculate device windspeeds when provided with meteorological windspeeds. Meteorological data for a month prior to a data outage is downloaded for a weather data source, and the meteorological data is filtered to select data of interest including timestamps and associated meteorological windspeeds. Device data for one or more energy generating devices is downloaded, and the device data is filtered to select data for the energy generating device of interest including a device identification of the energy generating device, measured windspeeds at the energy generating device, and associated timestamps. In the example, baseline time series windspeeds are determined by merging the device data and meteorological data based on the timestamps. FIG. 4 depicts an example baseline time series windspeed plot 402 illustrating device windspeeds and meteorological windspeeds obtained by plotting device windspeeds along with meteorological windspeeds. The goal moving forward in the example is to find the correction factor for the meteorological windspeeds for each energy generating device to obtain correct windspeeds as close as possible to each energy generating device's windspeeds.

Figure 5:
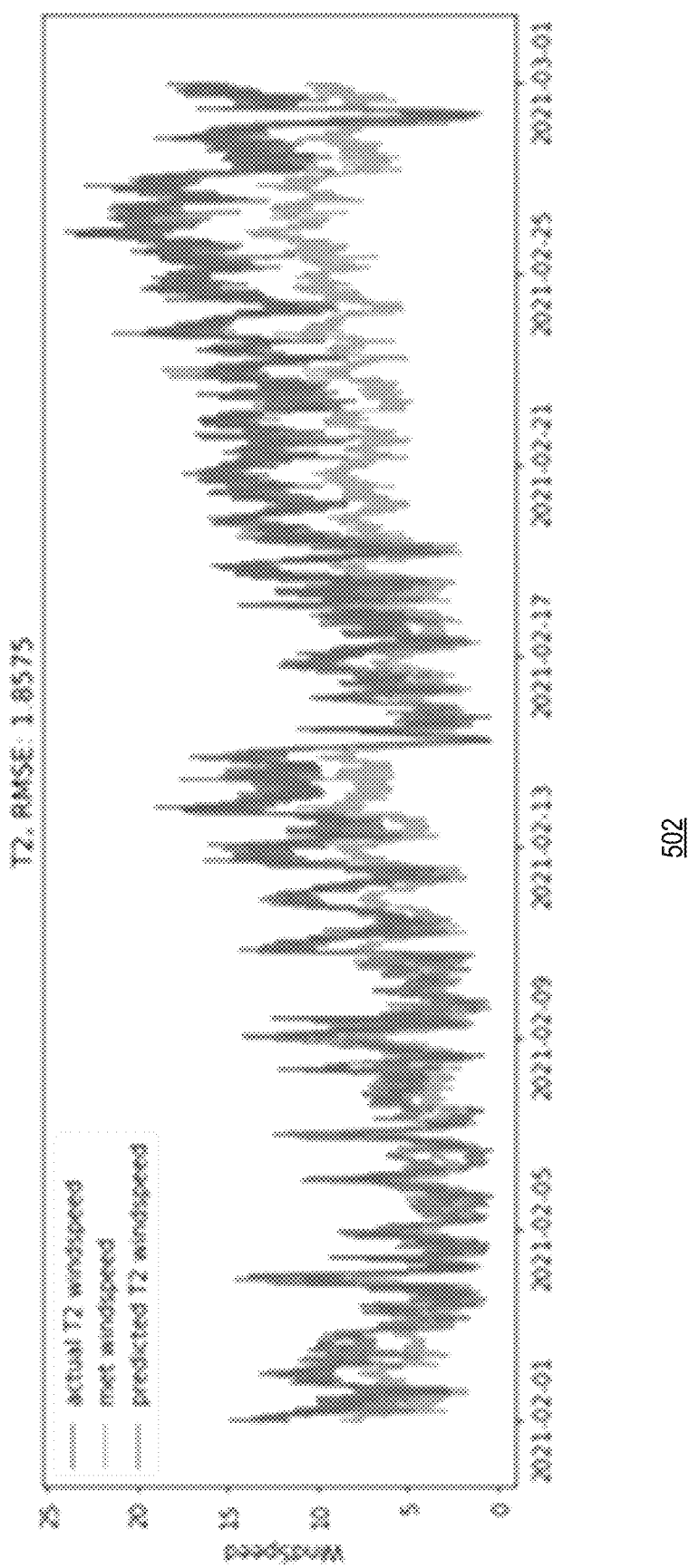
FIG. 5 depicts an example corrected time series windspeed plot illustrating actual device windspeeds, meteorological windspeeds, and predicted device windspeeds in accordance with some embodiments of the present disclosure.

Continuing with the particular example, a baseline root mean square (RMSE) is determined by calculating the device windspeed to be equal to the meteorological windspeed. For each energy generating device, a regression model is trained to obtain linear model parameters in the form of linear coefficients or each energy generating device's corrected windspeed. Next, corrected windspeeds for each energy generating device are calculated using the meteorological windspeeds and the linear coefficients from the regression model. FIG. 5 depicts an example corrected time series windspeed plot 502 illustrating actual device windspeeds, meteorological windspeeds, and predicted device windspeeds. Continuing with the particular example, the regression coefficients for each device along with meteorological windspeeds are used to update turbine windspeeds for the time periods that have missing device windspeed data.

The example method depicted in FIG. 3 also includes predicting 208 one or more estimated device windspeeds at the energy generating device during the particular time duration based on the meteorological data 204 using a trained model for the energy generating device. In another embodiment, a site location may include a number of different energy generating devices and a different trained model for each of the energy generating devices may be created using at least a portion of the historical meteorological data windspeed data 302 and the historical device windspeed data 304 associated with the particular energy generating device. During the particular embodiment, one or more estimated device windspeeds for each energy generating device is predicted using the meteorological data 204 and the trained model corresponding to the particular energy generating device.

Continuing with the particular example, device data for the missing time periods is downloaded and filtered to extract the timestamps for the missing time period. Meteorological windspeed data for the missing time periods is downloaded and filtered to extract the timestamps and associated meteorological windspeed data. The device data and meteorological windspeed data are merged based on the timestamps to obtain meteorological windspeed data for the missing time periods. Corrected device windspeeds are calculated using the regression model to predict one or more estimated device windspeeds for the energy generating device.

The example method depicted in FIG. 3 also includes determining 312 a reference energy production value for the energy generating device during the particular time period based on the one or more estimated device windspeeds utilizing a reference energy production algorithm. The reference energy production value for the energy generating device is representative of an amount of energy that would be expected to be produced by the energy generating device when under the wind conditions of the meteorological data 204 based on the one or more estimated device windspeeds. The reference energy production algorithm functions to convert the one or more estimated device windspeeds to a reference energy production value for the energy generating device. For example, a higher estimated device windspeed may be expected to generally produce a greater energy production value than a lower estimated device windspeed. In at least one embodiment, reference energy production value is based on the respective durations of each of a number of estimated device windspeeds during the particular time period. In particular embodiments, the reference energy production algorithm is based on one or more of an estimated windspeed of one or more near neighboring energy generating devices, a windspeed vs power curve associated with the energy generating device, or a machine learning algorithm trained to predict reference energy production value from estimated device windspeeds.

The example method depicted in FIG. 3 also includes determining 314 an estimated energy production loss for the energy generating device during the particular time period based on the reference energy production value. The estimated energy production loss for the energy generating device is representative of the loss in energy production from the energy generating device during the particular time period due to an unavailability of the energy generating device. In another embodiment, an estimated energy production loss for the site location of the energy generating device may be determined by aggregating individual energy production loss for a number of energy generating devices at the site location. In an embodiment, the determining 314 of the estimated energy production loss is responsive to receiving an indication of the unavailability of the device windspeeds during the particular time duration.

Accordingly, owners and operators of renewable energy power plants are able to track estimated energy loss during a particular time period due to various alarms and events such as an unavailability of an energy generating device. In an embodiment, the reference energy (i.e., the energy an energy generating device could have produced given the windspeed (or estimated windspeed based on near neighbors) is calculated using one or more algorithms (e.g., near neighbor, power curve method, ML based methods). The most accurate or a combination of the algorithms for reference energy is used for the EBA calculation. As a result, a more reliable EBA and overall energy loss calculation due to downtime events may be achieved. In some scenarios, reference energy may be calculated even when windspeed data is not missing. The reference energy and corresponding EBA calculations may be useful to determined unintended losses emanating from a particular device, e.g., due to underperformance. Reference energy may provide an indication of what energy the device should have produced compared to what the device actually produced even in cases in which windspeed data is not missing. In other scenarios, energy losses can be calculated even if a device is reporting windspeeds, e.g., when a turbine is offline but is reporting its own recorded windspeed. In such scenarios, the recorded windspeed in conjunction with the reference energy may be used to calculate losses, i.e., how much production loss occurred due to the turbine not operating.

In a particular example, the indication may be an alert indicating that the energy generating device is inoperative or otherwise not available. Owners and operators of renewable energy power plants have often negotiated contracts to allocate production losses to owners and operators. Typically, owners and operators perform this calculation on a ten minute basis by marking each ten minute period as available or unavailable based on any faults. This can be a cumbersome process. One or more embodiments may allow a user to set an alarm code classification for available (owner loss) or unavailable (operator loss). When alarms are received from OEMs, they may be automatically classified to correct the loss category to handle a large number of scenarios. Users may subsequently use a host of functions available such as Event edit functionality to edit/reclassify any misclassified downtime. Alternately, for any missing or incorrect downtime, users may used Add/Edit/Delete Alarms features to add or correct the downtime. In an example, when a user edits or otherwise changes a downtime event, availability calculations may be triggered that use reference energy calculations described above to calculate energy loss against a downtime resulting in immediate updates to availability and energy loss numbers.

Examples of scenarios in which a user may wish create a new alarm/event include: i) a situation in which a wind turbine has an outage but no alarm data was recorded and the user wants to add an event, ii) a situation in which multiple wind turbines had an outage and no data is recorded, and the user wants to add multiple events with the same start and end time; and iii), a situation in which a whole site had an outage and the user wishes to add a downtime for the whole site. In another example, a user may merge multiple event into a single event. In another example, a user may delete an event that is not to be included in a particular power loss calculation.

An embodiment of a non-transitory computer-readable medium may store instructions, that when executed by at least one processor, cause the at least one processor to determine that windspeed data indicating device windspeeds measured at an energy generating device are unavailable within a particular time duration; receive meteorological data associated with a site location of the energy generating device, the meteorological data including meteorological windspeed data collected within the particular time duration; and predict one or more estimated device windspeeds at the energy generating device during the particular time duration based on the meteorological data using a trained model for the energy generating device. The trained model is trained using a machine learning algorithm that utilizes historical meteorological windspeed data associated with the site location collected during a previous time duration and corresponding historical device windspeed data measured at the energy generating device during the previous time duration.

In an embodiment, the instructions may further cause the at least one processor to receive the historical meteorological windspeed data associated with the site location of the energy generating device; receive the historical device windspeed data measured at the energy generating device; and train the trained model using at least a portion of the historical meteorological windspeed data and the historical device windspeed data.

In an embodiment, the instructions may further cause the at least one processor to determine a reference energy production value for the energy generating device during the particular time period based on the one or more estimated device windspeeds utilizing a reference energy production algorithm.

In an embodiment, the reference energy production algorithm is based on one or more of an estimated windspeed of one or more near neighboring energy generating devices, a windspeed vs power curve associated with the energy generating device, or a machine learning algorithm.

In an embodiment, the instructions may further cause the at least one processor to determine an estimated energy production loss for the energy generating device during the particular time period based on the reference energy production value.

An embodiment of an apparatus includes at least one processor, and at least one memory. The at least one memory storing instructions, that when executed by the at least one processor, cause the at least one processor to determine that windspeed data indicating device windspeeds measured at an energy generating device are unavailable within a particular time duration; receive meteorological data associated with a site location of the energy generating device, the meteorological data including meteorological windspeed data collected within the particular time duration; and predict one or more estimated device windspeeds at the energy generating device during the particular time duration based on the meteorological data using a trained model for the energy generating device. The trained model is trained using a machine learning algorithm that utilizes historical meteorological windspeed data associated with the site location collected during a previous time duration and corresponding historical device windspeed data measured at the energy generating device during the previous time duration.

In an embodiment, the instructions further cause the at least one processor to receive the historical meteorological windspeed data associated with the site location of the energy generating device; receive the historical device windspeed data measured at the energy generating device; and train the trained model using at least a portion of the historical meteorological windspeed data and the historical device windspeed data.

In an embodiment, the instructions further cause the at least one processor to determine a reference energy production value for the energy generating device during the particular time period based on the one or more estimated device windspeeds utilizing a reference energy production algorithm.

In an embodiment, the reference energy production algorithm is based on one or more of an estimated windspeed of one or more near neighboring energy generating devices, a windspeed vs power curve associated with the energy generating device, or a machine learning algorithm.

In an embodiment, the instructions further cause the at least one processor to determine an estimated energy production loss for the energy generating device during the particular time period based on the reference energy production value.

Readers will appreciate that although the examples described above relate to embodiments where a determination is made that windspeed data indicating device windspeeds measured at an energy generating device are unavailable, meteorological data that includes windspeed is received, and predictions are made regarding one or more estimated device windspeeds at the energy generating device, in other embodiments meteorological data that does not include windspeed data may be predicted in a similar manner. For example, similar techniques may be used to calculate energy loss during an outage for other types of renewable energy sources. For example, similar may be used to calculate energy loss during an outage for other forms of renewable energy sources such as a solar energy array, a hydroelectric energy source, a geothermal energy source, any other renewable energy production source. As such, some embodiments may include: determining that meteorological data indicating meteorological conditions measured at an energy generating device are unavailable within a particular time duration; receiving replacement meteorological data associated with a site location of the energy generating device, the replacement meteorological data including meteorological data collected within the particular time duration by a data collection device that is not part of (or affixed to) the energy generating device; and predicting one or more estimated meteorological conditions at the energy generating device during the particular time duration based on the replacement meteorological data, where such a prediction is made using a trained model for the energy generating device. In such an example, the trained model may have been trained using a machine learning algorithm that utilizes historical meteorological data associated with the site location collected during a previous time duration and corresponding historical replacement meteorological data during the previous time duration.

In view of the explanations set forth above, readers will recognize that the benefits of calculating energy loss during an outage include:

Increased accuracy for increased accuracy in estimating energy loss during outage of an energy generating device.

Allow owners and operators of renewable energy power plants to track estimated energy loss due to various alarms and events.

Example embodiments of the present disclosure are described largely in the context of a method for calculating energy loss for energy generating devices during an outage in accordance with some embodiments of the present disclosure. Readers will appreciate, however, that the present disclosure also can be embodied in a computer program product disposed upon computer readable storage media for use with any suitable data processing system. Such computer readable storage media can be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method of the disclosure as embodied in a computer program product. Persons skilled in the art will recognize also that, although some of the exemplary embodiments described in this specification are oriented to software installed and executing on computer hardware, nevertheless, alternative embodiments implemented as firmware or as hardware are well within the scope of the present disclosure.

The present disclosure can be a system, a method, and/or a computer program product. The computer program product can include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium can be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network can include copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure can be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions can execute entirely on the user's computer, partly on the user's computer, as a stand-alone software package, partly on the user's computer and partly on a remote computer or entirely on the remote computer or server. In the latter scenario, the remote computer can be connected to the user's computer through any type of network, including a local area network (LAN) or a wide area network (WAN), or the connection can be made to an external computer (for example, through the Internet using an Internet Service Provider). In some embodiments, electronic circuitry including, for example, programmable logic circuitry, field-programmable gate arrays (FPGA), or programmable logic arrays (PLA) can execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the disclosure. It will be understood that each block of the flowchart illustrations and/or block diagrams, and combinations of blocks in the flowchart illustrations and/or block diagrams, can be implemented by computer readable program instructions.

These computer readable program instructions can be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions can also be stored in a computer readable storage medium that can direct a computer, a programmable data processing apparatus, and/or other devices to function in a particular manner, such that the computer readable storage medium having instructions stored therein includes an article of manufacture including instructions which implement aspects of the function/act specified in the flowchart and/or block diagram block or blocks.

The computer readable program instructions can also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams can represent a module, segment, or portion of instructions, which includes one or more executable instructions for implementing the specified logical function(s). In some alternative implementations, the functions noted in the block can occur out of the order noted in the figures. For example, two blocks shown in succession can, in fact, be executed substantially concurrently, or the blocks can sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes can be made in various embodiments of the present disclosure. The descriptions in this specification are for purposes of illustration only and are not to be construed in a limiting sense. The scope of the present disclosure is limited only by the language of the following claims.

What is claimed is:

1. A method, comprising:
receiving historical meteorological windspeed data associated with a site location of an energy generating device collected during a previous time duration;
receiving historical device windspeed data measured at the energy generating device during the previous time duration;
training, using a machine learning algorithm, a neural network using at least a portion of the historical meteorological windspeed data and the historical device windspeed data;
receiving an alert indicating that windspeed data indicating device windspeeds measured at the energy generating device are unavailable within a particular time duration;
receiving meteorological data associated with the site location of the energy generating device, the meteorological data including meteorological wind speed data collected within the particular time duration; and
predicting one or more estimated device windspeeds at the energy generating device during the particular time duration based on the meteorological data using the neural network for the energy generating device.

2. The method of claim 1, further comprising:
determining a reference energy production value for the energy generating device during the particular time period based on the one or more estimated device windspeeds utilizing a reference energy production algorithm.

3. The method of claim 2, wherein the reference energy production algorithm is based on one or more of an estimated windspeed of one or more near neighboring energy generating devices, a windspeed vs power curve associated with the energy generating device, or a machine learning algorithm.

4. The method of claim 2, further comprising:
determining an estimated energy production loss for the energy generating device during the particular time period based on the reference energy production value.

5. The method of claim 4, wherein the determining of the estimated energy production loss is responsive to receiving the alert indicating the unavailability of the device windspeeds during the particular time duration.

6. The method of claim 1, wherein the particular time duration corresponds to a downtime event of the energy generating device.

7. The method of claim 1, wherein the energy generating device comprises a wind turbine.

8. The method of claim 7, wherein the estimated device windspeeds correspond to an estimated windspeed at a height of a turbine hub of the wind turbine.

9. A non-transitory computer-readable medium storing instructions, that when executed by at least one processor, cause the at least one processor to:
receive historical meteorological windspeed data associated with a site location of an energy generating device collected during a previous time duration;
receive historical device windspeed data measured at the energy generating device during the previous time duration;
train, using a machine learning algorithm, a neural network using at least a portion of the historical meteorological windspeed data and the historical device windspeed data;
receive an alert indicating that windspeed data indicating device windspeeds measured at the energy generating device are unavailable within a particular time duration;
receive meteorological data associated with the site location of the energy generating device, the meteorological data including meteorological windspeed data collected within the particular time duration; and
predict one or more estimated device windspeeds at the energy generating device during the particular time duration based on the meteorological data using the neural network for the energy generating device.

10. The non-transitory computer-readable medium of claim 9, wherein the instructions further cause the at least one processor to:
determine a reference energy production value for the energy generating device during the particular time period based on the one or more estimated device windspeeds utilizing a reference energy production algorithm.

11. The non-transitory computer-readable medium of claim 10, wherein the reference energy production algorithm is based on one or more of an estimated windspeed of one or more near neighboring energy generating devices, a windspeed vs power curve associated with the energy generating device, or a machine learning algorithm.

12. The non-transitory computer-readable medium of claim 10, wherein the instructions further cause the at least one processor to:
determine an estimated energy production loss for the energy generating device during the particular time period based on the reference energy production value.

13. An apparatus, comprising:
at least one processor; and
at least one memory, the at least one memory storing instructions, that when executed by the at least one processor, cause the at least one processor to:
receive historical meteorological windspeed data associated with a site location of an energy generating device collected during a previous time duration;
receive historical device windspeed data measured at the energy generating device during the previous time duration;
train, using a machine learning algorithm, a neural network using at least a portion of the historical meteorological windspeed data and the historical device windspeed data;
receive an alert indicating that windspeed data indicating device windspeeds measured at the energy generating device are unavailable within a particular time duration;
receive meteorological data associated with the site location of the energy generating device, the meteorological data including meteorological windspeed data collected within the particular time duration; and
predict one or more estimated device windspeeds at the energy generating device during the particular time duration based on the meteorological data using the neural network for the energy generating device.

14. The apparatus of claim 13, wherein the instructions further cause the at least one processor to:
- determine a reference energy production value for the energy generating device during the particular time period based on the one or more estimated device windspeeds utilizing a reference energy production algorithm.

15. The apparatus of claim 14, wherein the reference energy production algorithm is based on one or more of an estimated windspeed of one or more near neighboring energy generating devices, a windspeed vs power curve associated with the energy generating device, or a machine learning algorithm.

16. The apparatus of claim 14, wherein the instructions further cause the at least one processor to:
- determine an estimated energy production loss for the energy generating device during the particular time period based on the reference energy production value.

17. The apparatus of claim 14, wherein the particular time duration corresponds to a downtime event of the energy generating device.

* * * * *